United States Patent [19]

Todd

[11] Patent Number: 5,139,193
[45] Date of Patent: Aug. 18, 1992

[54] FLUXLESS RESOLDERING SYSTEM AND FLUXLESS SOLDERING PROCESS

[75] Inventor: Thomas W. Todd, San Diego, Calif.

[73] Assignee: Toddco General, Inc., San Diego, Calif.

[21] Appl. No.: 534,124

[22] Filed: Jun. 4, 1990

[51] Int. Cl.⁵ .................... B23K 1/00; B23K 3/00
[52] U.S. Cl. ................... 228/180.2; 228/219; 228/239; 228/240; 228/6.2; 228/42
[58] Field of Search ............... 228/180.2, 206, 207, 228/218-220, 240, 6.2, 42, 239

[56] References Cited

U.S. PATENT DOCUMENTS 3,754,698  8/1973  Bochinski et al. .................. 228/220
4,979,664  12/1990 Lyons et al. ..................... 228/180.2

Primary Examiner—Samuel M. Heinrich
Attorney, Agent, or Firm—Bernard L. Kleinke; Jerry R. Potts; William Patrick Waters

[57] ABSTRACT

A fluxless reflow soldering processing and system having a reactive inert gas control arrangement coupled to a conventional reflow soldering head for enabling solder to wet metallic surfaces for joining purposes. The gas control arrangement includes a set of gas regulating valves and heat exchange units for supplying selected quantities of inert gases under pressure at various temperatures to a soldering area during the soldering process. The inert gases are employed to clean the soldering area of metal oxides and are used to facilitate the forming of a reliable solder joint by inhibiting the formation of metal oxides and by helping to cool down the solder joint in a substantially uniform manner.

28 Claims, 1 Drawing Sheet

FLUXLESS RESOLDERING SYSTEM AND FLUXLESS SOLDERING PROCESS

TECHNICAL FIELD

The present invention relates in general to a reflow soldering system and a method for soldering a microelectronic device to a printed circuit board. More particularly, the present invention relates to a fluxless reflow soldering system and a fluxless soldering process for soldering microelectronic devices to printed circuit boards.

BACKGROUND ART

There have been many different types and kinds of reflow soldering systems for mounting microelectronic devices to a printed circuit board. A typical reflow soldering system generally includes a stencil printer for depositing solder alloy containing paste at points of attachment on a printed circuit board, one or more pick and place machines for locating the electronic components on the predeposited solder paste, a means of heating the assembly to reflow the solder paste, and a cleaning device for removing flux residues from the assembled printed circuit board.

With respect to such systems, the predeposited solder paste has generally included some type of flux material to not only enable the solder to wet the connecting metallic surfaces of the printed circuit board and the microelectronic device but to also enable heat to flow from one side of the connecting joint to another without intervention of an insulating air gap which can result in a defective soldered joint.

While the utilization of a flux based soldering paste has been satisfactory for some applications, the decomposition of the flux with resulting excessive amounts of ionic contaminants and other chemical agents at solder joints causes unwanted and undesired electrical shorting and product failures over time. Moreover, under repeated use of the heating means, which is generally a hot bar, accumulated flux and residues build up on the hot bar and produce a physical heat transfer barrier between the hot bar and the solder joint. Also, the residue build up on the hot bar results in uneven heating of the soldering surface making it difficult, if not impossible, to heat uniformly and to hold the leads of the microelectronic device in proper alignment with the connecting pads of the printed circuit board. Such residue on the printed circuit board and build up on the hot bar necessitate costly and time consuming cleaning operations which lessen throughput production.

Attempts have been made to overcome the problems associated with the utilization of flux based soldering pastes. For example, chlorinated fluorocarbons because of their ability to penetrate into small openings beneath microelectronic devices, as well as providing an inert atmosphere during the cleaning operations have proven to do an excellent job of cleaning surface mount assemblies by removing the flux residue.

While such a technique for cleaning flux residues has proven satisfactory recent environmental concerns over the emission of chlorofluorocarbon solvents into the atmosphere, and their subsequent role in the depletion of the ozone layer has resulted in restricted use of such solvents, with eventual phase out to protect our environment.

Other attempts have been made to overcome the aforementioned flux residue problems in an environmentally safer manner. For example, instead of using chlorofluorocarbon an alcohol base chemical composition has been utilized which includes chemical constituents which react with metal oxide to cause a low flux residue to occur. While such an alcohol base chemical composition helps residue flux residues, the composition has not proven sufficiently efficient for some applications.

Other alternate cleaning methods have also been developed but have also proven too expensive for automated, high yield production line systems. For example, one such system employed a heating system enclosed within a large oven filled with a large quantity of nitrogen gas to help prevent the formation of metal oxides during the reflow soldering process. While such a technique reduced the quantity of flux residues, the utilization of large ovens has proven to be unsatisfactory for most applications because the oven is very expensive to operate and the flux residues are not entirely eliminated.

More recently, other attempts have been made to develop fluxless soldering processes for surface mounting microelectronic devices. For example, N. Bandyopadhyay et al., in a recent article entitled "Development of a Fluxless Soldering Process for Surface Mount Technology" discloses a process whereby printed circuit boards and their microelectronic devices are attached with a solder paste under a reactive fluxing atmosphere. While such a system may be satisfactory for some applications, the utilization of a large oven with a large quantities of reactive fluxing atmosphere appears to be relatively expensive for assembly line production. Moreover, the disclosed technique still produces residues as the process still requires the use of a solder paste.

Therefore, it would be highly desirable to have a new and improved reflow soldering system and soldering technique which substantially eliminates the need to use any type of residue forming paste material. Moreover, such a system should not require the use of large expensive ovens or large quantities of reactive fluxing gases to clean the soldering area of undesirable and unwanted metal oxides and to enable solder to wet the metallic surfaces that are to be joined.

DISCLOSURE OF INVENTION

Therefore, the principle object of the present invention is to provide a new and improved fluxless reflow soldering system and a method for soldering microelectronic devices to a printed circuit board without the need for use any type of residue forming paste material for enabling solder to wet metallic surfaces.

Another object of the present invention is to provide such a new and improved fluxless soldering system and fluxless soldering process which substantially reduces, if not completely eliminates metal oxides, ionic contaminants and other chemical agents which cause electrical shorts and product failures.

Still yet another object of the present invention is to provide such a new and improved fluxless soldering system which is safe and highly efficient in a relatively inexpensive mass production manufacturing technique. In this regard, such a fluxless reflow soldering system is easily incorporated into a conventional reflow soldering operation in a relatively inexpensive manner.

Briefly, the above and further objects of the present invention are realized by providing a fluxless reflow soldering process and fluxless reflow soldering system having a reactive inert gas control arrangement which is adapted to be coupled to a conventional reflow soldering head for cleaning a soldering surface of unwanted and undesired metal oxides and for enabling predeposited solder material to reflow and easily wet metallic surfaces. The gas control arrangement includes a set of gas flow regulators and heat exchange units for supplying selected quantities of inert and reactive gases under pressure at various temperatures to a soldering area during the soldering process. The inert and reactive gases are employed to clean the soldering area of metal oxides; to inhibit the formation of metal oxides during the soldering process and to cool down molten solder joints in a substantially uniform manner to facilitate the forming of reliable solder joints.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein.

BEST MODE FOR CARRYING OUT THE INVENTION

Figure 1:
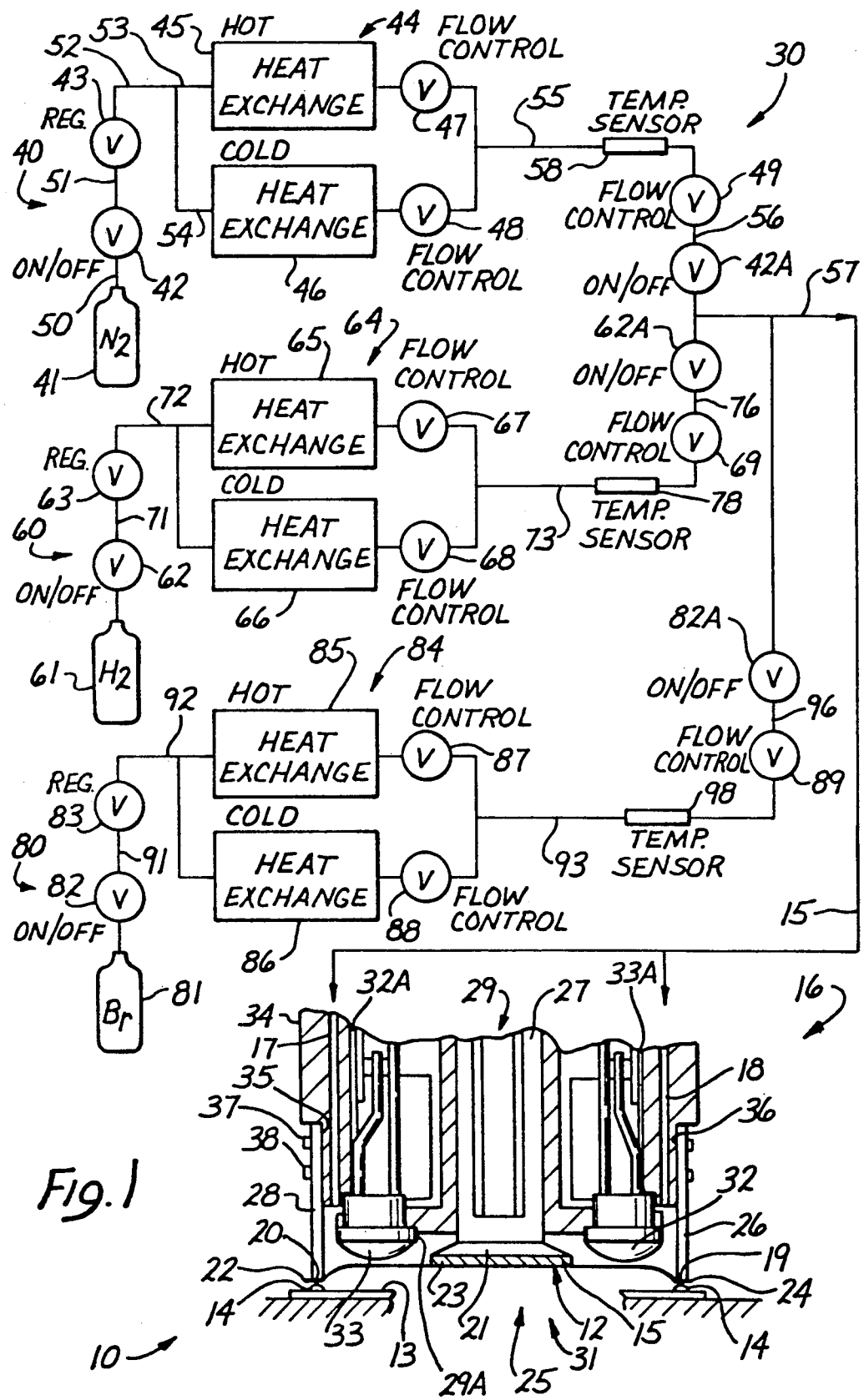
FIG. 1 is a diagrammatic block diagram of a fluxless reflow soldering system which is constructed in accordance with the present invention, illustrating a reflow soldering head in a partly fragmentary cross sectional side elevational view.

Referring now to the drawings and more particularly to FIG. 1 thereof, there is shown a fluxless reflow soldering system 10 which is constructed in accordance with the present invention. The system 10 of the present invention enables a circuit device, such as a microelectronic device 12, to be soldered onto a printed circuit board 13 without the use of flux, thereby increasing the quality of the assembled printed circuit board by eliminating or greatly reducing metal oxides and ionic contaminates. The system 10 is adapted to be utilized with a conventional pick and place mechanism (not shown) for retrieving and positioning the microelectronic device 12 on a printed circuit board pad or pads 14 with predeposited solder.

The system 10 includes a gas distribution arrangement shown generally at 30, which is adapted to be in liquid communication with a reflow soldering head 16 connected to the pick and place mechanism. The reflow soldering head 16 is similar to the reflow solder head described in copending U.S. patent application Ser. No. 07/484,382.

The reflow soldering head 16 includes a set of gas outlet channels, such as channels 17 and 18, connected in liquid communication with the gas distribution arrangement 30 by a conduit, shown diagrammatically at 15. The channels 17 and 18 enable gas under pressure in the gas distribution arrangement 30 to be directed toward the metallic surfaces of the leads of the microelectronic device, shown generally at 22 and 24 and the pads of the printed circuit board, such as the pads shown generally at 14. The reflow soldering head 16 also includes a set of elongated thermod blades, such as thermod blades 26 and 28, for causing the predeposited solder on the pads to reflow for connecting the leads 22 and 24 to the pads of the printed circuit board 13. It should be understood that after the predeposited solder has been caused to reflow, the thermod blades 26 and 28 continue to hold the leads 22 and 24 to the pads until the solder has solidified bonding the leads 22 and 24 to the pads of the printed circuit board 13.

While the reflow solder head 16 is shown as the preferred embodiment of the present invention, it will become apparent to those skilled in the art that any solder head or soldering device could be coupled to a gas distribution arrangement, such as arrangement 14 that does not require a reflow soldering operation but yet still requires the elimination of metal oxides, ionic contaminants and the like for the purpose of forming reliable solder joints in a soldering operation.

In operation, the pick and place mechanism lowers the microelectronic device 12 into engagement with the pads of the printed circuit board 13 with the thermod blades 26 and 28 holding firmly the leads 22 and 24 in engagement with the pads, such as pads 14.

As the leads 22 and 24 of the microelectronic device 12 are being lowered into engagement with the pads of the printed circuit board 13, the thermod blades 26 and 28 are heated to a sufficient temperature to preheat the leads 22 and 24 for presoldering purposes. When the leads are directly above the pads, the gas distribution arrangement 30 discharges a sufficient amount of a heated inert gas, such as nitrogen, to purge the channels 18 and 20 and to heat the pads of the printed circuit board 13 disposed adjacent to the thermod blades 26 and 28 to a temperature that substantially corresponds to the temperature of the leads 22 and 24. In this regard, when the leads 22 and 24 are brought into engagement with the pads 14 of the printed circuit board, the pads 14 and the leads 22 and 24 are substantially at the same temperature.

Once the leads 22 and 24 and pads 14 are firmly engaged together, the gas distribution arrangement 30 discharges a sufficient amount of a heated reactive gas, such as bromine gas, to vigorously clean the leads 22 and 24, the pads, and the soldering area immediately adjacent to the pads of the printed circuit board 13. In this regard, the bromine gas reacts with the metallic surfaces to cause any metal oxides thereon to be separated from the soldering surface.

Subsequent to the soldering area, the pads 14 and the leads 22 and 24 being cleaned, the gas distribution arrangement 30 discharges a sufficient quantity of heated inert gas mixture, such as nitrogen and hydrogen, to help facilitate completing the separation of metal oxides that are formed as the thermod blades are heated to soldering temperatures. The separated metal oxides and other ionic contaminates are removed by any suitable means, such as a suction hood (not shown).

Immediately after the predeposited solder has liquified so the leads and pads to be immersed in the molten solder, the electrical energy supplied to the thermod blades 26 and 28 is de-energized, thus allowing the thermod blades 26 and 28 to begin to cool. When the electrical energy to the blades 26 and 28 is deenergized, the gas distribution arrangement 30 begins discharging a cooling inert gas, such as nitrogen, into the soldering area to cool and to help solidify the molten solder joint. In this regard, in order to prevent the solder joint from cooling too fast or slow the gas distribution arrangement 30 causes the temperature of the nitrogen gas to be decreased in accordance with a predetermined cool down cycle sequence which will be described hereinafter in greater detail.

At the end of the cool down cycle, the gas distribution arrangement 30 terminates discharging the cooling gas and the soldering head 16 is retracted completing the soldering process.

Considering now the reflow soldering head 16 in greater detail with reference to FIG. 1, the soldering head 16 generally comprises a pick up assembly 31 which includes a set of light emitting diodes, such as diodes 32 and 33, for illuminating the leads of the device 12 and the printed circuit board 13 during the reflow solder operation. The pick up assembly 31, holds a circuit device, such as the device 12, in a firm stationary manner for transportation to the printed circuit board pads, such as the pads shown at 14.

For the purpose of permitting the leads of the microelectronic device 13 to be soldered to the pads of a printed circuit board, such as the printed circuit board 13, each of the thermod blades 26 and 28 include heating elements (not shown) disposed therein. The heating elements of the thermods 26 and 28 are connected to a high current electrical source (not shown) to permit the conversion of electrical energy to thermod energy for causing the predeposited solder on the pads of the printed circuit board 13, to reflow when the thermod blades are brought into engagement with the pads of the board 13 and electrically energized to reflow soldering temperatures.

Considering now the pick up assembly 31 in greater detail with reference to FIG. 1, the pick up assembly 31 includes a generally rectangular block shaped mount 34 for supporting the thermod blades 26 and 28 in a fixed position. In this regard, the mount is composed of a thermally insulating material for electrically connecting to the mount from the thermods and for confining the thermal energy to the blades 26 and 28.

The mount 34 includes a set of flat substantially smooth mounting surfaces, such as surfaces 35 and 36 for mounting the blades 26 and 28 to the head 16. The mounting surfaces 35 and 36 include a pair of threaded holes (not shown) which are adapted to receive a pair of mounting screws, such as screws 37 and 38. In this regard, each of the thermods, such as thermod 28, also includes a pair of corresponding mounting holes (not shown) to coincide with the mounting hole in the head 16 and dimensioned to receive the mounting screws 37 and 38 for permitting the thermod blade 28 to be mounted to the face of the mounting surface 35. The mounting screws 37 and 38 also permit the power conductors (not shown) to the high current power source to be connected to the heating elements of the thermods.

For the purpose of permitting the leads of a microelectronic device, such as device 12, to be held with the tips of its leads against the tip portions of the thermod blades, such as tip portions 19 and 20, the pick up assembly 31 also includes a vacuum active picker, shown generally at 21. The picker 21 when activated holds the microelectronic device 12 in precise orientation relative to the head 16.

The picker 21 is centrally disposed in the undersurface of the head 16 and extends downwardly from the underfree terminating in a lip 23 that defines an opening 25 that is in fluid communication with an air vacuum source (not shown). The picker 21 is generally conically-shaped having a cylindrical tube portion 27 that passes through a hole 29 that is centrally disposed in the head 16.

The opening 25 is dimensioned to be slightly smaller than an integrated circuit or microelectronic body, such as body 15 forming part of the device 12. In this regard, when the vacuum source to the picker 21 is activated and the lip 23 of the picker 21 comes into resting engagement on the body 15 of the device 12, a vacuum suction force is produced holding the body 15 to the lip 23 of the picker 21, with a portion of the distal ends of the leads of the device, such as leads 22 and 24 held against the tip portions, such as tip portions 19 and 20, of the thermal blades 26 and 28 respectively.

For the purpose of mounting the diodes 32 and 33 to the head 16, a set of electrical connectors, such as the connectors 32A and 33A are disposed within the head 16. The connectors 32A and 33A are connected to a low current voltage source (not shown). The solder head 16 also includes a set of openings; such as the opening 29A, that permits a diode to be attached electrically to a connector. The openings, such as opening 29A, are generally circular having a diameter that is slightly larger than the diameter of the base portion of a light emitting diode, such as diode 33 for permitting the diode 33 to be mounted partially within the opening 29A to partially shield the diode 33 from the thermal energy being radiated by the thermod blades, such as blade 28.

Considering now the gas distribution arrangement 30 in greater detail with reference to FIG. 1, the gas distribution arrangement 30 generally comprises three gas regulating units: a nitrogen gas regulating unit 40, a hydrogen gas regulating unit 60, and a bromine gas regulating unit 80. Each of the units 40, 60 and 80 are connected in fluid communication with the conduit 15 by a universal coupler 57 for supplying gas under pressure to the gas outlet channels 17 and 18 disposed in the soldering head 16.

Considering now the nitrogen gas regulating unit 40 in greater detail with reference to FIG. 1, the nitrogen gas regulating unit 40 generally includes a source of nitrogen gas under pressure, such as a gas cylinder 41 filled with nitrogen gas for distribution to the reflow soldering head 16. A short stubby conduit 50 connects the gas cylinder 41 in fluid communication with an on/off valve 42 for manually controlling the flow of nitrogen gas from the cylinder 41. In this regard, when the on/off valve 42 is disposed in an off position the gas cylinder 41 including its associated valve 42 may be removed from the gas distribution arrangement 30 to permit the cylinder 41 to be refilled with nitrogen gas.

A conduit 51 connects the on off valve 42 in fluid communication with a regulating valve 43 that enables the flow of nitrogen gas to the reflow soldering head 16 to be controlled in a regulated manner. The regulating valve 43 is manually operable. While valve 43 is manually operable in the preferred embodiment of the present invention, it will be understood by those skilled in the art that valve 43 may be an electrically controlled solenoid valve connected to a control processor (not shown). The regulating valve 43 enables the quantity of nitrogen gas delivered to the reflow soldering head 16 to be controlled in a substantially precise manner.

In order to control the temperature of the nitrogen gas supplied to the reflow soldering head 16, the nitrogen gas regulating unit 40 also includes a thermal energy exchanger 44 which is connected in fluid communication with the regulating valve 43 by a conduit 52. The thermal energy exchanger 44 includes a pair of parallel connected heat exchange units 45 and 46 for heating and cooling the nitrogen gas respectively. The exchange units 45 and 46 are connected to conduit 52 by conduit couplers 53 and 54 respectively for placing the exchange units 45 and 46 in fluid communication with the gas cylinder 41.

Each of the units 45 and 46 have an associated flow control valve shown generally at 47 and 48 respectively for controlling the flow of hot and cold nitrogen gas supplied by the heat exchanger 44.

The flow control valve 47 and 48 are both connected in liquid communication by a T-coupler 55 to a unit control valve 49 that controls the flow of nitrogen gas to the reflow soldering head 16. A temperature sensor 58 disposed in the T-coupler 55 enables a user to determine the temperature of the nitrogen gas delivered by the heat exchanger 44.

In this regard, a user can manually adjust the flow of hot and cold nitrogen gas flowing through valves 47 and 48 respectively to adjust the temperature of the nitrogen gas delivered by the heat exchanger 44. In the preferred embodiment of the present invention, the valve 47 and 48 as well as the regulation valve 49 are manually operable. It should be understood however, that valves 47-49 may be electrically controlled solenoid valves connected to the control processor.

In order to disconnect the nitrogen gas regulating unit 40 from the gas distribution arrangement 30, the nitrogen gas regulating unit 40 also includes an on/off valve 42A that is connected in series between the line control valve 49 and the conduit 15 by couplers 56 and 57 respectively. Coupler 56 is a straight line coupler, while coupler 57 is a universal coupler connecting the regulating units 40, 60 and 80 together in fluid communication with conduit 15.

Considering now the hydrogen gas regulating unit 60 in greater detail with reference to FIG. 1, the hydrogen gas regulating unit 60 is similar to the nitrogen gas regulating unit 40 and is coupled to the reflow solder head 16 through conduit 15 and the universal coupler 57. The hydrogen gas regulating unit 60 supplies a regulated quantity of hydrogen gas at a temperature of about 100° C. when the thermod blades 26 and 28 are heated to soldering temperature for helping to facilitate the soldering operation by reducing the formation of metal oxides. In this regard, the hydrogen gas is mixed with nitrogen gas in a ratio of 10 parts hydrogen to 90 parts nitrogen during the aforementioned time period.

As best seen in FIG. 1, the hydrogen gas regulating unit 60 includes a supply of hydrogen gas stored in a gas cylinder 61. The cylinder 61 has a conventional on/off valve 62 attached thereto for enabling the cylinder 61 to be removed from the gas regulating unit 60 for refilling purposes.

The on/off valve 62 is connected in fluid communication with a manually operable gas regulating valve 63 for controlling the quantity of hydrogen gas supplied from the cylinder 61 during the reflow soldering process. While the preferred embodiment of the present invention is a manually operable regulating valve, it will be understood by those skilled in the art that the regulating valve 63 can be an electrically operated solenoid valve connected to a processor controller. The valve 63 is a conventional manually operable regulating value and is connected to the on/off valve 62 by a conduit 71.

In order to control the temperature of the hydrogen gas supplied to the reflow soldering head 16, the hydrogen unit 60 also includes a thermal energy exchanger, shown generally at 64. The exchanger 64 is connected in fluid communication between the valve 63 and a unit control regulating valve 69 by T-couplers 72 and 73 respectively. A temperature sensor 78 is disposed in the T-coupler 73 for enabling a user to determine the temperature of the hydrogen gas delivered by the heat exchanger 64.

In order to enable the hydrogen gas regulating unit 60 to be disconnected from the gas arrangement 30, the unit 60 also includes an output shut off valve 62A. Valve 62A is a manually operable valve and is substantially similar to valve 62. Valve 62A is connected in fluid communication between the unit control valve 69 and conduit 15 by a conduit 76 and the universal coupler 57 respectively.

Considering now the thermal energy exchanger 64 in greater detail with reference to FIG. 1, the exchanger 64 includes a pair of parallel connected hot and cold heat exchanger units 65 and 66 respectively. The input to each respective heat exchange unit is coupled to the regulating valve 63 by the coupler 72.

In order to regulate the temperature of the hydrogen gas supplied to the reflow soldering head 16, the thermal energy exchanger 64 also includes a pair of manually operable flow control valves 67 and 68 respectively. In this regard, a user can manually adjust the flow of hot and cold hydrogen gas flowing through valves 67 and 68 until the temperature sensor 78 indicates a desired temperature for the hydrogen gas flowing to the reflow soldering head 16.

While in the preferred embodiment of the present invention, valves 67 and 68 are manually operable it will be understood by those skilled in the art that electrically operable solenoid valves coupled to a control processor coupled also be utilized.

Considering now the bromine gas regulating unit 80 in greater detail with reference to FIG. 1, the bromine gas regulating unit 80 generally comprises a thermal energy exchanger 84 disposed between a supply of bromine gas and the reflow soldering head 16.

The bromine gas regulating unit 80 supplies a regulated quantity of bromine gas to the reflow soldering head 16 at a temperature of about 80° to 100° C. In a more preferred temperature range, the bromine gas is supplied at a temperature of about 85° C. and 95° C. The most preferred temperature is 90° C.

In order to control the temperature of the bromine gas, the thermal energy exchanger 84 includes a pair of parallel heat exchange units 85 and 86. Unit 85 heats the bromine gas, while unit 86 cools the bromine gas.

A pair of manually operable flow control valves 87 and 88 are connected respectively to units 85 and 86. It will be understood by those skilled in the art, the valves 87 and 88 may also be electrically operable valves. For example, a control processor (not shown) can be connected to a pair of solenoid valves to regulate the flow of bromine gas supplied to the head 16.

As best seen in FIG. 1, the supply of bromine gas is stored in a gas cylinder 81 having a conventional on/off valve 82. The on/off valve 82 enables the cylinder 81 to be disconnected from the gas regulating unit 80 so that the cylinder 81 may be refilled with bromine has whenever required.

In order to regulate the flow of bromine gas supplied to the reflow soldering head 16, the bromine gas regulating unit 80 also includes a pair of manually operable regulating valves 83 and 89 respectively. Valve 83 controls the volume of bromine gas delivered by the cylinder 81 while the valve 89 controls the volume of bromine gas delivered to the reflow soldering head 16.

In the preferred embodiment of the present invention, both valves 83 and 89 are manually operable. However, it will be understood by those skilled in the art, that solenoid valves coupled to a control processor could also be used in place of the manually operable valves 83 and 89, respectively.

For the purpose of disconnecting the bromine gas regulating unit 80 from the arrangement 30, the unit 80 also includes a disconnect on/off valve 82A. The disconnect valve 82A is disposed between conduit 15 and the valve 89 by couplers 57 and 96 respectively.

As best seen in FIG. 1, the supply of bromine gas stored in cylinder 81 is in fluid communication with the reflow soldering head 16 by a set of conventional gas connecting couplers. In this regard, the regulating valve 83 is connected between the on/off valve 82 and the thermal exchanger 84 by couplers 91 and 92 respectively. Similarly, the output of the thermal exchanger 84 is connected in fluid communication with the safety valve 89 by a T-coupler 93.

A temperature sensor 98 is disposed in T-coupler 93 and enables a user to determine the temperature of the bromine gas delivered by the heat exchanger 84. In this regard, a user can manually adjust the flow of hot and cold bromine gas flowing through valves 87 and 88 until the temperature of the bromine gas sensed by sensor 98 is at a desired given temperature for causing a reactive process.

Considering now the fluxless soldering method in greater detail with reference to FIG. 1, assume the pick and place mechanism has lowered a microelectronic device, such as device 12, directly above the pads of a printed circuit board, such as printed circuit board 13. The pads are prepared for the soldering of the leads thereto by first purging the channels 18 and 20 and the area in the immediate vicinity of the pads with nitrogen gas. In this regard, the hydrogen and bromine gas regulating units 60 and 80 respectively are disabled while the nitrogen gas regulating unit 40 is activated to supply nitrogen gas under pressure at a temperature between about 80° C. and about 100° C. for a sufficient amount of time to saturate the area about to be soldered with nitrogen gas and to raise the temperature of the pads to approximately the same preheated temperature of the leads 22 and 24. A more preferred temperature range for the nitrogen gas is between about 85° C. and about 95° C., while the most preferred temperature is about 90° C.

After the soldering area has been initially prepared with nitrogen gas, the leads 22 and 24 are lowered into engagement with the pads 14 of the printed circuit board and held in place by the thermod blades 26 and 28 of the soldering head 16. The nitrogen gas regulating unit 40 is then deactivated and the bromine gas regulating unit 80 is activated to supply bromine gas under pressure at a temperature between about 80° C. and about 100° C. for a sufficient amount of time to vigorously clean the soldering area of metal oxides. A more preferred temperature range for the bromine gas is between about 85° C. and about 95° C., while the most preferred temperature is about 90° C.

After the metal oxides have been cleaned from the soldering area the bromine gas regulating unit 80 is disabled and the thermod blades 26 and 28 are rapidly raised to soldering temperatures. In order to inhibit the formation of metal oxides during the soldering process, a mixture of hydrogen/nitrogen gas mixed in a ratio of 90% nitrogen to 10% hydrogen is blown into the soldering area. The amount of each respective gas delivered to the soldering head 16 is controlled by valves 43 and 63 which regulates the volume of gas supplied by system 40 and 60, respectively. In this regard, it should be understood that a control processor can also be utilized to regulate the regulator valve in the bromine gas regulating unit 80 to control the flow of selected gases at appropriate temperatures from each respective heat exchanger, such as heat exchanger 44.

The nitrogen and hydrogen gas regulating units 40 and 60 supply the mixture of nitrogen/hydrogen gas under pressure at a temperature about 100° C. during the time the thermod blades 26 and 28 are heated to soldering temperatures (approximately 250° C.). In this regard, the hydrogen/nitrogen gas mixture facilitate the removal of metal oxides which float to the surface of the molten solder.

After the energy supplied to the thermod blades 26 and 28 is removed, the nitrogen gas regulating unit 40 is disabled resulting in the solder area being bathed in pure nitrogen gas during the period the molten solder is solidifying. In order to facilitate solidifying of the solder joint at a proper rate so that the molten solder does not crust or crystallizes improperly, the nitrogen gas is decreased in temperature at a rate of approximately 50° C. per second until the thermod blades 26 and 28 are cooled to a temperature of approximately 80° C.

When the thermod blades 26 and 28 are cooled to approximately 80° C. the nitrogen gas distribution system 40 is disabled. These steps are repeated for each solder operation.

Considering now the operation of the fluxless reflow soldering system 10 in greater detail with reference to FIG. 1, system 10 has five separate and distinct stages of operation: (1) a purging stage; (2) a cleaning stage; (3) a soldering stage; (4) a cooling stage; and (5) a shut-down stage. Each of these stages will be described in greater detail hereinafter.

Considering now the purging stage in greater detail with reference to FIG. 1, during the purging stage the conduit 15, the soldering head channels 17 and 18 and the area surrounding the soldering area are saturated with nitrogen gas at a temperature between about 80° C. and about 100° C. In this regard, during the purging stage the nitrogen gas directed into the soldering area raises the temperatures of the pads 14 to a temperature that approximates the same as the preheated temperature of the leads 22 and 24.

The purging stage commences when the pick and place mechanism complete transporting a microelectronic device, such as device 12, to a position slightly above the pads of a printed circuit board, such as the pads 14. In this regard, the device 12 is brought sufficiently close to the printed circuit board 13 so that the nitrogen gas flowing through channels 17 and 18 is discharged against the pads 14 and the area surrounding the pads with sufficient pressure to raise the temperature of the pads 14 between a temperature of about 80° C. and about 100° C. A more preferred temperature range is about 85° C. and about 95° C., while the most preferred temperature is about 90° C.

Referring now to FIG. 1, during the purging stage, valves 69 and 89 are deactivated while valve 49 is fully activated to provide a maximum flow of nitrogen gas to the soldering area for purging the channels 17 and 18 and the area around the soldering area a sufficient amount of time with heated nitrogen gas to raise the temperature of the pads to about 90° C. Therefore, nitrogen gas saturates the soldering area a predetermined time period.

In order to control the temperature of the nitrogen gas during the purging stage, valves 43, 47 and 48 are manually adjusted to control the flow of hot and cold nitrogen gas in a sufficient mixture to cause the nitrogen gas flowing through valve 49 to be at a temperature about 90° C. In this regard, a user determines the temperature of the nitrogen gas via the temperature sensor 58 as he or she adjusts the flow control valves 47 and 48. It should be understood that to prepare the nitrogen gas for the purging stage, valve 43 is manually adjusted to its fully activated position while valves 47 and 48 are preset to positions that will permit the initial flow of purging nitrogen gas delivered to the soldering head 16 to approximate 90° C.

Considering now the cleaning stage in greater detail with reference to FIG. 1, during the cleaning stage the pads 14, and the area surrounding the pads are saturated with bromine gas to vigorously clean the pads 14 and the soldering area of metal oxides and other ionic contaminates that can cause product failure. In order to vigorously clean the pads 14, the unit control valve 49 is completely deactivated after the pads 14 have been purged with nitrogen gas a sufficient amount of time to raise their temperature to about 90° C. Unit 80 is then activated by fully opening valve 63 and the unit control valve 89 to provide a maximum flow of bromine gas to the area around the soldering area, the pads 14 and the leads 22 and 24. The bromine gas saturates the soldering area a sufficient amount of time to allow the bromine gas to react with the metallic surface in the soldering area to separate the metal oxides, and ionic contaminates from these surfaces.

In order to facilitate the separating of the metal oxides and ionic contaminates in a highly efficient manner, the bromine gas is discharged into the soldering area at a temperature of about 80° C. and about 100° C. A more preferred temperature range is at a temperature of about 85° C. and about 95° C., while the most preferred temperature is 90° C.

To assure that the bromine gas is initially discharged at a temperature about 90° C. the valve 83 is activated at the beginning of the purging stage and valves 87 and 88 are preset so the temperature of the bromine gas at the temperature sensor 98 will approximate 90° C. Thus, when valve 89 is opened during the cleaning stage the bromine gas initially flowing through valve 89 will approximate 90° C.

During the cleaning stage the temperature of the bromine gas is controlled by manually adjusting the flow of hot and cold bromine gas via valves 67 and 68 to cause the temperature of the bromine gas flowing through valve 89 to be approximately 90° C. The temperature of the bromine gas is sensed by the temperature sensor 78, thus enabling a user to easily verify the temperature of the bromine gas flowing through valve 89 as he or she adjusts the flow of hot and cold bromine gas to valve 89 via valves 87 and 88.

While in the preferred embodiment of the present invention bromine gas is used for cleaning the soldering area, it will be understood by those skilled in the art that other halogen group type gases, such as chlorine, fluorine, astatine and iodine can be utilized, as well as other gas mixtures which are sufficiently reactive to separate metal oxides, such as a hydrogen/nitrogen gas mixture.

Considering now the soldering stage in greater detail with reference to FIG. 1, after the soldering area, pads 14 and leads 22 and 24 have been vigorously cleaned with bromine gas, the soldering stage is commenced for inhibiting the formation of metal oxides and other ionic contaminates and for removing the metal oxides and other ionic contaminates from the soldering area.

In this regard, the pick and place mechanism lowers the head 16 until the blades 26 and 28 engage firmly the leads 22 and 24 with the pads 14. As the device 12 is being lowered, the user deactivates valve 83 so any residue bromine gas in unit 80 may be discharged into the soldering area. Once the leads 22 and 24 engage the pads 14, the valve 89 is deactivated. Blades 26 and 28 are then raised rapidly to soldering temperatures.

At or about the same time when valve 89 is deactivated, unit control valves 49 and 69 are adjusted to cause a mixture of 90% nitrogen gas and 10% hydrogen gas to be delivered to the soldering head 16. The mixture of nitrogen and hydrogen gas helps to inhibit the formation of metal oxides. In this regard, the hydrogen gas help facilitate the removal of the metal oxides previously separated by the bromine gas while the nitrogen gas helps to inhibit the formation of new metal oxides during the soldering stage. To assure that the flow rate of the nitrogen/hydrogen gas is maintained at a maximum flow rate to saturate the soldering area with the gas mixture, regulating valves 43 and 63 are fully activated.

In order to help facilitate the complete separating of the metal oxides and ionic contaminates and in order to help inhibit the formation of metal oxides, the nitrogen/hydrogen gas mixture is supplied to the soldering area at a temperature between about 80° C. and about 100° C. A more preferred temperature range is between about 85° C. and about 95° C., while the most preferred temperature is about 90° C.

It should be understood that as the metal oxides become completely separated from the metallic surfaces, the contaminates are removed from the soldering area by means (not shown). In this regard, the nitrogen/hydrogen gas mixture is supplied for a sufficient amount of time to substantially remove the metal oxides from the soldering area. Therefore, the nitrogen/hydrogen gas mixture is supplied to the soldering head 16 a predetermined period of time.

Considering now the cooling process in greater detail with reference to FIG. 1, after the time period of the soldering stage has elapsed, unit 60 is deactivated by closing valves 63 and 69 and unit 40 is activated by fully opening valves 43 and 49. This action commences the cooling stage to cause the molten solder joints formed at pads 14 to be cooled at a sufficient rate to form a solid reliable solder joint. In this regard, the nitrogen gas cools down the molten solder at a rate sufficiently fast so the solder crystallizes properly but not so fast that the solder forms a crusty surface with molten solder disposed beneath the crusty surface.

In order to cool the molten solder joints at pads 14 in a controlled manner, the temperature of the nitrogen gas flowing to the soldering area is decreased to a temperature of about 0° C. at a rate of about 50° C. per second.

To control the temperature of the nitrogen gas delivered to the soldering head 16, valves 47 and 48 are adjusted in a substantially proportional manner by deactivating valve 47 toward a fully closed position and activating valve 48 toward a fully opened position. It should be understood that temperature sensor 58 enables a user to determine the temperature of the nitrogen gas as he or she manually adjusts the valves 47 and 48.

Considering now the shut-down stage in greater detail with reference to FIG. 1, the shut down stage assures that all the unit control valves 49, 69 and 89 are shut off to deactivate units 40, 60 and 80.

In this regard, after the cold nitrogen gas has flowed a sufficient amount of time to completely solidify the solder joints at the pads 14, valve 49 and the picker unit 31 are deactivated. The pick and place mechanism is then retracted and valves 43, 63 and 83 are fully opened to preactivate the units 40, 60 and 80 for the next soldering operation. Valves 47–48, 67–68, and 87–88 are also set to their pre-established position to initially adjust the gas flows to commence at a temperature about 90° C.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A fluxless reflow soldering system for facilitating reliable solder joints between the pads of a printed circuit board and the leads of a micro-electronic device, comprising:
   preheating means for raising the temperature of the pads to a given preheated temperature;
   cleaning means for bathing the pads with a reactive gas, said reactive gas having a sufficient temperature to clean vigorously said pads of unwanted metal oxides;
   thermode blade means for preheating the leads to about said given preheated temperature and for causing subsequently a predeposited quantity of solder disposed on the pads to become molten and reflow;
   gas distribution means for bathing the leads and pads with selected inert gases to help facilitate the forming of a reliable solder joint connection; and
   gas directing means mounted in close proximity to said thermode blade means and connected to said gas distribution means and to said cleaning means for flowing said reactive gas and said inert selected gases under pressure into a soldering area to bathe the leads and pads with selected gases; and
   means for mounting said gas directing means in close proximity to said thermode blade means for helping to facilitate the bathing of the leads and pads with inert and reactive gases.

2. In a fluxless reflow soldering system for facilitating reliable solder joint between the pads of a printed circuit board and the leads of a microelectronic device, an arrangement comprising:
   reflow soldering means for soldering the leads of the microelectronic device to the pads of the printed circuit board;
   gas distribution means for bathing the leads and pads with selected gases to facilitate the forming of a reliable solder joint connection;
   said reflow soldering means having gas directing means for flowing gas under pressure into a soldering area to bathe the leads and pads with selected gases; and
   means for connecting said gas distribution means in fluid communication;
   said gas distribution means includes a plurality of gas regulating units, each gas regulating unit having a supply of a selected gas under pressure, heat exchange means for selectively heating and cooling said selected gas, and valve control means for distributing a given quantity of said selected gas to said reflow soldering means.

3. An arrangement according to claim 2, wherein said gas is one selected from the group consisting of hydrogen, nitrogen and bromine.

4. An arrangement according to claim 3, wherein each one of said heat exchange means includes a heating unit for heating a selected gas and a cooling unit for cooling a selected gas.

5. An arrangement according to claim 4, wherein said cooling unit is sufficiently large to cool a selected volume of gas at a rate of 50° C. per second.

6. An arrangement according to claim 5, wherein said heating unit is sufficiently large to heat a selected volume of gas to a temperature of about 100° C.

7. A fluxless soldering process comprising the steps of:
   preheating a soldering area with hot nitrogen gas, said nitrogen gas having a sufficient temperature to raise the temperature of said soldering area to a given preheated temperature range;
   bathing said soldering area in a reactive gas, said reactive gas having a sufficient temperature to vigorously clean said soldering area of metal oxides;
   heating said soldering area to soldering temperatures to cause a predeposited quantity of solder in said soldering area to become molten and reflow;
   flowing a gas mixture of nitrogen and hydrogen gas, having a sufficient temperature to help facilitate the complete separating of said metal oxides from said soldering area and to help inhibit the formation of metal oxides;
   removing said metal oxides from said soldering area;
   bathing said soldering area with cool nitrogen gas, said nitrogen gas having a temperature substantially below soldering temperatures; and
   lowering the temperature of said cool nitrogen at a sufficient rate to solidify said molten solder.

8. A process according to claim 7, wherein said gas mixture of nitrogen and hydrogen gas consists of about 90% nitrogen gas and about 10% of hydrogen gas.

9. A process according to claim 7, wherein said cool nitrogen gas is decreased in temperature from about 100° C. to a sufficiently lower temperature to cool the soldering area to about 80° C.

10. A process according to claim 9, wherein said cool nitrogen gas is decreased in temperature at a rate of about 50° C. per second.

11. A process according to claim 10, wherein said nitrogen gas is decreased to a temperature about 0° C.

12. A process according to claim 7, wherein said hot nitrogen gas has a temperature in a range between about 80° C. and about 100° C.

13. A process according to claim 12, wherein a more preferred range is between about 85° C. and about 95° C.

14. A process according to claim 13, wherein a most preferred temperature is about 90° C.

15. A process according to claim 7, wherein said reactive gas is selected from the halogen group of gases.

16. A process according to claim 15, wherein a most preferred reactive gas is bromine gas.

17. A process according to claim 7, wherein said reactive gas has a temperature in a range between about 80° C. and about 100° C.

18. A process according to claim 17, wherein a more preferred range is between about 85° C. and about 95° C.

19. A process according to claim 18, wherein a most preferred temperature is about 90° C.

20. A process according to claim 7, wherein said gas mixture has a temperature in a range between about 80° C. and about 100° C.

21. A process according to claim 20, wherein a more preferred range is about 85° C. and about 95° C.

22. A process according to claim 21, wherein a most preferred temperature is about 90° C.

23. A reflow soldering head, comprising:
holding means for retaining in a stationary position a microelectronic device for assembly to a printed circuit board, said device having a plurality of spaced apart leads;
preheating means for raising the temperature of a set of pads disposed on said printed circuit board to a given preheated temperature;
cleaning means for bathing said pads with a reactive gas, said reactive gas having a sufficient temperature to permit said gas to vigorously clean said pads of unwanted metal oxides;
thermode blade means for causing a given quantity of predeposited solder disposed on said set of pads to be heated to a sufficient temperature to become molten and reflow;
gas distribution means for facilitating the bathing said leads and said pads in selected inert gas mixtures to facilitate the forming of a fluxless solder joint;
gas directing means for flowing said reactive gas and said inert gas mixtures under pressure onto said pads for facilitating the forming of a fluxless solder joint; and
means for connecting said gas directing means and said gas distribution means in fluid communication for supplying said gas directing means with selected gases for heating, cooling and cleaning and pads to facilitate the forming of said fluxless solder joint.

24. A fluxless reflow soldering system comprising:
means for directing a low temperature inert gas under pressure toward a substantially limited soldering area to purge the atmosphere surrounding said soldering area substantially of oxygen and for raising the temperature of said soldering area toward a given preheating temperature;
means for directing a low temperature reactive gas under pressure toward the preheated soldering area to clean it vigorously of metal oxides, said given temperature being sufficient to cause the preheated area to help the cleaning action of the reactive gas and being insufficient to cause a predeposited quantity of solder disposed in said soldering area to become molten and reflow; and
thermode blade means for helping to increase rapidly the temperature of said soldering area above said given preheating temperature toward a solder melting temperature to cause said reactive gas to complete substantially the vigorous cleaning of said soldering area and for causing subsequently said predeposited quantity of solder to become molten and reflow.

25. A fluxless reflow soldering system according to claim 24 further comprising:
means for directing a mixture of nitrogen and hydrogen gas under pressure toward the molten solder, said mixture having a sufficient temperature to help inhibit the formation of metal oxides and to help facilitate the complete separating of the metals oxides from said soldering area so the metal oxides may be subsequently removed therefrom.

26. In a fluxless soldering system, a system for cooling a quantity of molten solder, comprising:
means for directing a low temperature nitrogen gas under pressure towards the molten solder; and
means for decreasing the temperature of the nitrogen gas progressively, said nitrogen gas causing the temperature of the molten solder to be lowered at a sufficient rate to cause the solder to solidify properly but not to cause the solder to form a crystallized outer surface.

27. A method of forming a fluxless solder joint comprising:
directing a low temperature inert gas under pressure toward a substantially limited soldering area;
purging the atmosphere surrounding said soldering area substantially of oxygen;
increasing the temperature of said soldering area toward a given preheated temperature;
directing a low temperature reactive gas under pressure toward the soldering area to clean it vigorously of metal oxides, said low temperature gas not having a sufficient temperature to cause a predeposited quantity of solder disposed in said soldering area to become molten and reflow and a sufficient temperature to help clean the soldering area of metal oxides;
increasing rapidly the temperature of said soldering area above said given preheated temperature toward a solder melting temperature to cause said reactive gas to complete substantially the vigorous cleaning of said soldering area; and
causing subsequently said predeposited quantity of solder to become molten and reflow.

28. In a fluxless soldering system a method for cooling a quantity of molten solder, comprising:
flowing a low temperature nitrogen gas under pressure toward the molten solder;
decreasing the temperature of the nitrogen gas progressively at a predetermined rate, said nitrogen gas having a temperature substantially below soldering temperatures; and
lowering the temperature of the molten solder at a rate sufficient to cause the solder to solidify properly but not to cause the solder to form a crystallized outer surface.

* * * * *